United States Patent [19]

Muterspaugh

[11] Patent Number: 5,157,786
[45] Date of Patent: Oct. 20, 1992

[54] BIASING NETWORKS FOR BALANCED MIXERS

[75] Inventor: Max W. Muterspaugh, Indianapolis, Ind.

[73] Assignee: Thomson Consumer Electronics, Indianapolis, Ind.

[21] Appl. No.: 576,641

[22] Filed: Aug. 31, 1990

[51] Int. Cl.$^5$ .............................................. H04B 1/26
[52] U.S. Cl. .................................... 455/326; 455/330
[58] Field of Search ............... 455/188, 189, 190, 191, 455/326, 343, 330; 358/191.1, 193.1

[56] References Cited

U.S. PATENT DOCUMENTS

| | | | |
|---|---|---|---|
| 3,189,836 | 6/1965 | Podell | 328/156 |
| 3,227,955 | 1/1966 | Yasuda et al. | 325/449 |
| 3,628,152 | 12/1971 | Carlson | 325/383 |
| 3,983,489 | 9/1976 | Gittinger | 325/449 |
| 4,306,311 | 12/1981 | Igarashi | 455/327 |
| 4,601,063 | 7/1986 | Price | 455/317 |
| 4,607,394 | 8/1986 | Nightingale | 455/327 |
| 4,949,398 | 8/1990 | Maas | 455/326 |
| 4,955,076 | 9/1990 | Noboru | 455/343 |
| 4,979,233 | 12/1990 | Kawahara | 455/326 |
| 4,996,718 | 2/1991 | Shiomi | 455/326 |

OTHER PUBLICATIONS

"RCA Color Television Basic Service Data CTC 133 Series" published by RCA Corporation, Consumer Electronics, Indianapolis, Ind. in 1985.
"RCA/GE Color Television Service Data CTC 156/157" published by RCA Corporation, Consumer Electronics, Indianapolis, Ind. in 1989.
"RCA Television Service Data Supplement Chassis CTC 108 Series" published by RCA Corporation, Consumer Electronics, Indianapolis, Ind. in 1981.
"RCA Color Television Basic Service Data CTC 108 Series" published by RCA Corporation, Consumer Electronics, Indianapolis, Ind. by 1982.
"Introduction to Radio Frequency Design", by W. H. Hayward, published by Prentice-Hall in 1982, pp. 232-246.
"Reactive Loads-The Big Mixer Menace", by Peter Will appearing in the magazine Microwave, Apr. 1971, pp. 38-42.

*Primary Examiner*—Curtis Kuntz
*Attorney, Agent, or Firm*—Joseph S. Tripoli; Peter M. Emanuel

[57] ABSTRACT

A balanced mixer, including at least one pair of switching type diodes and at least one impedance transformer, such as balun or RF transformer, for coupling at least one of a radio frequency (RF) or local oscillator (LO) signal to the diodes in a balance impedance configuration, also includes a voltage source biasing network for supplying a bias voltage to the mixing diodes through a relatively low source impedance. The bias voltage network comprises a voltage divider including relatively high value resistor and a relatively low value resistor connected in series between a source of supply voltage and ground though a winding of the impedance transformer. The bias voltage biases the mixing diodes slightly below the threshold of conduction so that the performance of the mixer can be optimized over a relatively wide LO signal amplitude range and so that the power requirements of the LO can be reduced. The low source impedance of the voltage source inhibits variations of the bias voltage due to the rectification of the LO signal but is isolated from ground for RF and LO signals because the connection to ground is through the winding of the impedance transformer.

9 Claims, 4 Drawing Sheets

BIASING NETWORKS FOR BALANCED MIXERS

The present invention concerns balanced mixers useful television and radio receivers and particularly to biasing networks for biasing the mixing devices of the mixers.

RELATED APPLICATION

The present application is related to U.S. patent application Ser. No. 337,798 for a "Single Balanced Mixer with Output Filter" of Muterspaugh and Anderson, filed Apr. 13, 1989 now U.S. Pat. No. 5,034,994, and assigned to the same assignee as the present application.

BACKGROUND

A mixer is a three port network which translates an input signal at one frequency to another frequency. To affect this translation, the input signal is heterodyned or "mixed" with another input signal by a non-linear device. This process generates two primary output signals having frequencies which are equal to the sum of and the difference between the frequencies of the two input signals. However, unwanted mixing products are usually also generated. In a turner of a television or radio receiver, a radio frequency (RF) signal received form a RF stage is mixed with a local oscillator (LO) signal generated by a local oscillator to produce an intermediate (IF) signal.

An excellent description of various types of mixers, their operation and their relative advantages and disadvantages is provided in *Introduction to Radio Frequency Design*, by W. H. Hayward, published by Prentice Hall, copyright 1982, pages 232–245.

Some mixers utilize an active device, such as a transistor configured as an amplifier, while others utilize a passive device, such as diode. Passive mixers have an advantage over active mixers in that active mixers tend to amplify unwanted mixing products, making it more difficult to remove them. The mixing devices of mixers may be operated in a "square" mode or in a "switching" mode. Switching mode mixers tend to generate fewer unwanted products than square law mixers. Of the switching mode mixers, so called "balanced" mixers provide unique advantages, among them being the elimination of at least one of the two input signals at the other input and at the output of the mixer. This and other advantages of balanced mixers will be discussed in greater detail below.

The above identified patent application of Muterspaugh and Anderson discloses a singly-balanced mixer. RCA brand color television receivers including CTC-156 and 157 chassis, documented in "RCA/GE Color Television Service Data—CTC 156/157", published by Thomson Consumer Electronics, Indianapolis, Ind. in 1989, employ tuners of the TCCR and TCHR type with a singly-balanced mixer similar to the one disclosed in the Muterspaugh and Anderson patent application. These singly-balanced mixers include a single pair of mixing diodes and a single balun for coupling the LO and RF signals to the mixing diodes in a balanced impedance configuration.

U.S. Pat. No. 4,601,063 of Price discloses a doubly-balanced mixer. RCA brand color television receivers including CTC-133 chassis, documented in "RCA Color Television Basic Service Data CTC 133 Series", published by RCA Corporation, Indianapolis, Ind. in 1985, employs a doubly-balanced mixer similar to the one disclosed in the Price patent. These doubly-balanced mixers include two pair of mixing diodes arranged in a bridge configuration and two baluns for coupling respective ones of the LO and RF signals to the mixing diodes in a balanced impedance configuration. Each pair of diodes are biased by a current source network including a voltage supply and a resistor coupled between the voltage supply and the junction of the two diodes.

SUMMARY OF THE INVENTION

The present invention is based in part on the recognization that in order for the advantages of balanced mixers to be reliably produced, the bias for the mixing devices, e.g., diodes, of balanced mixers should be more stringently controlled than in the prior art. More specifically, the present inventor has recognized that rather than biasing the diodes from a current source, the diodes of a balanced mixer should be biased from a voltage source having a relatively low value source impedance. The present invention is also based in part in the recognition of the manner in which a voltage source biasing network for a balanced mixer can be simply and inexpensively provided. These and other aspects of the invention will be described below in detail with reference to the accompanying Drawing.

BRIEF DESCRIPTION OF THE DRAWING

In the accompanying Drawing.

In the various Figures, corresponding elements are identified by the same or similar reference numbers. In addition, the schematicic representations of FIGS. 1, 2 and 3 are arranged in the same manner so that similarities and differences between the various embodiments may be readily discerned.

DETAILED DESCRIPTION OF THE VARIOUS EMBODIMENTS

Figure 1:
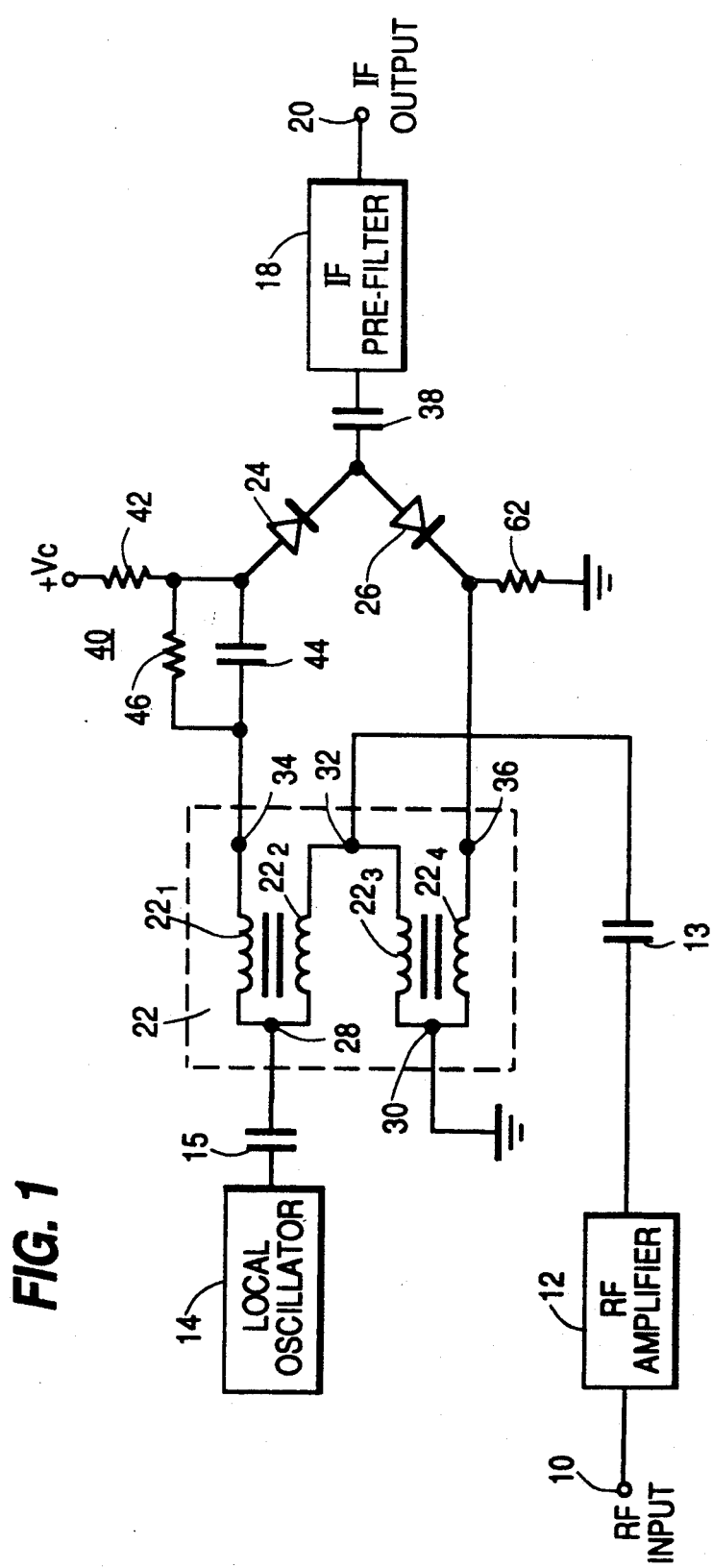
FIG. 1 is a schematic representation of a tuner including a singly-balanced mixer constructed in accordance with an aspect of the present invention.
Figure 2:
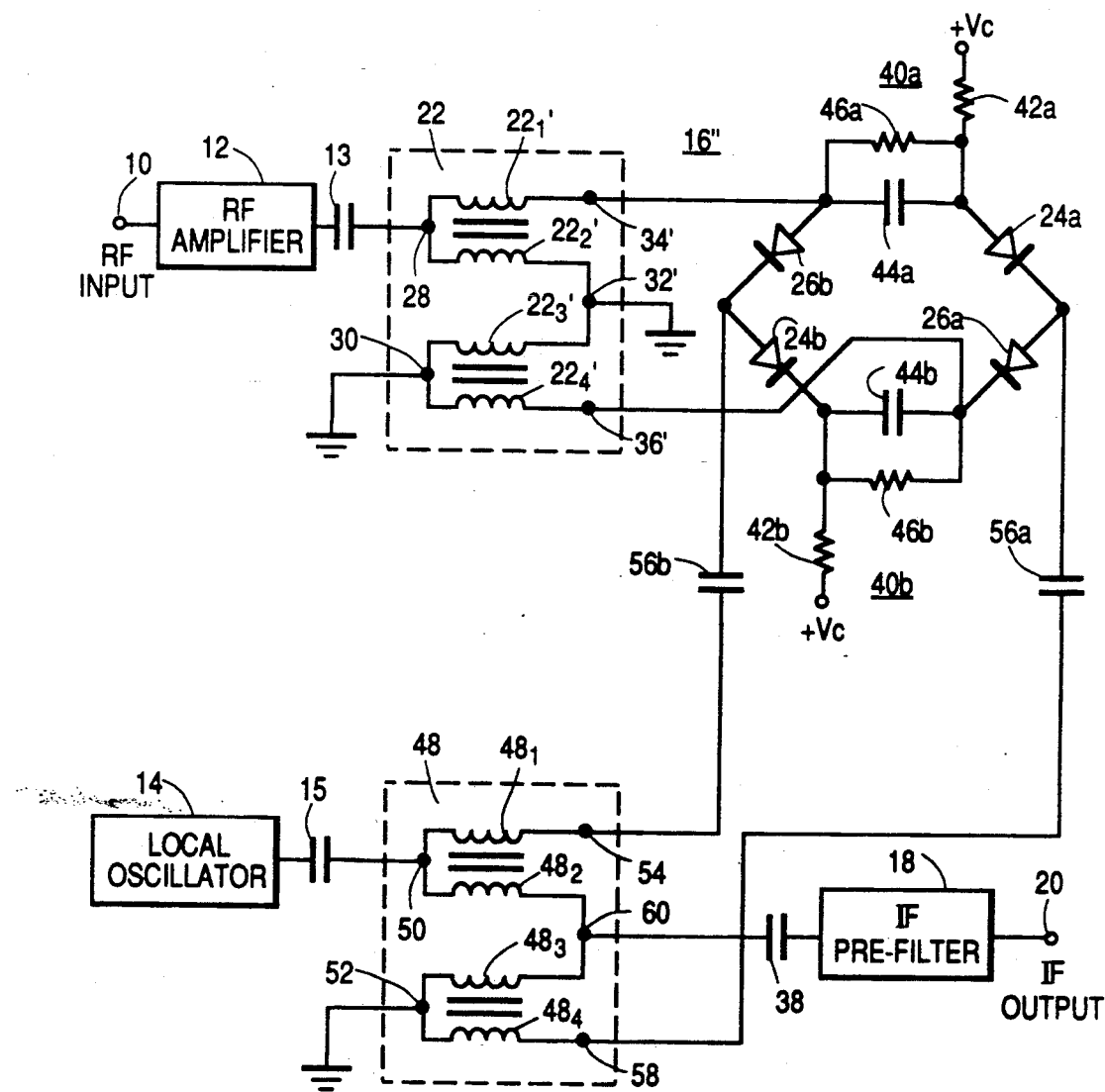
FIG. 2 is a schematic representation of a doubly-balanced mixer constructed in accordance with another aspect of the present invention.
Figure 3:
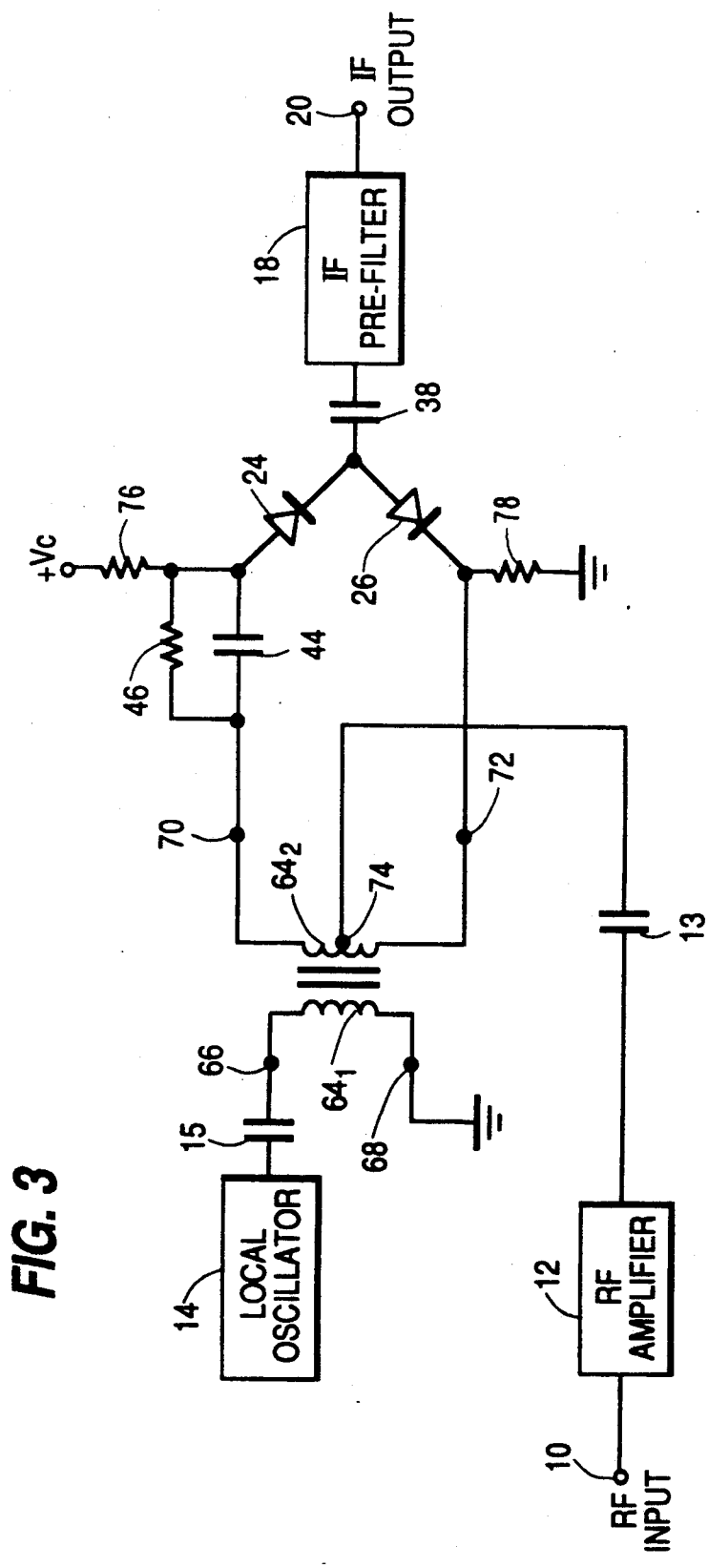
FIG. 3 is a schematic representation of a tuner including another singly-balanced mixer constructed in accordance with still another aspect of the present invention.

The tuners shown in FIGS. 1, 2 and 3 are useful in both television and radio receivers. However, by way of example, the tuners will be described with respect to the television environment.

As shown in FIGS. 1, 2 and 3, a radio frequency (RF) signal supplied by an antenna or other RF television signal source, such as a cable distribution system, is coupled by way of an RF input terminal 10 to a tunable RF amplifier 12. A tunable local oscillator 14 generates a local oscillator (LO) signal. The amplified RF signal and the LO signal are coupled to a balanced mixer 16 which combines (heterodynes) these two signals to produce an intermediate frequency (IF) signal. Desirably, the IF signal produced by mixer 16 is filtered by an IF "pre-filter" 18 before being coupled to the IF section of the television receiver by way of IF output terminal 20. Pre-filter 18 is designed to be more selective than the conventional IF filters utilized in the IF section of television receivers in order to significantly attenuate undesired mixer products as well as first and second adjacent television channel signals which may cause distortion components in subsequent amplifier stages. Pre-filter 18 may comprise a double-tuned Butterworth filter. Pre-filter 18 is the subject matter of he copending Muterspaugh application identified above.

Singly-balanced mixers 16 and 16' shown in FIGS. 1 and 3, respectively, are singly-balanced mixers having a single pair of mixing diodes and a single impedance transformation network for coupling the RF and LO signals to the mixing diodes in a balance impedance configuration. The impedance transformation nework of singly-balanced mixer 16 shown in FIG. 1 comprises a balun 22. Balun 22 includes two pairs of bifilar windings $22_1$, $22_2$ and $22_3$, $22_4$ configured in conventional fashion to convert the unbalanced or single-ended impedance configuration at the output of local oscillator 14 to the balanced or double-ended configuration needed to drive mixing diodes 24 and 26. The LO signal is coupled through a capacitor 15 to a first input terminal 28 of balun 22, at the junction of bifilar windings $22_1$ and $22_2$, and a second input terminal 30, at the junction of bifilar windings $22_3$ and $22_4$, is connected to ground. The amplified RF signal is coupled through a capacitor 13 to a terminal 32 at the junction of bifilar windings $22_2$ and $22_3$. A "center" terminal 32, at the junction of bifilar windings $22_3$ and $22_4$, is connected to ground. Diodes 24 and 26 are connected in series, poled in the same sense, between a first output terminal 34, at one end of winding $22_1$, and a second output terminal 36, at one end of winding $22_4$. An IF signal is produced at the junction of diodes 24 and 26 and is coupled through a capacitor 38 to IF pre-filter 18.

The tuner described so far with respect to FIG. 1 (without a biasing network 40 to be described below) is similar to the tuner disclosed in the Muterspaugh and Anderson application and to the TCCR and TCHR type tuners employed in RCA brand color television receivers including CTC 156 and CTC 157 chassis, documented in "RCA/GE Color Service Data—CTC 156/157" published by Thomson Consumer Electronics, Inc., Indianapolis, Ind.

As earlier indicated, the present invention is particularly concerned with biasing networks for balanced mixers. Biasing network 40 for singly-balanced mixer 16 shown in FIG. 1 comprises a relatively large value resistor 42 connected between a source of supply voltage $+V_c$ and the anode of diode 24, a RF by-pass capacitor 44, having negligible impedance in the frequency range of interest, connected between the anode of diode 24 and terminal 34 of balun 22, and a relatively low value resistor 46 connected in parallel with capacitor 44. However, before describing the need for and particular significance of the configuration of biasing network 40 used in singly-balanced mixer 16 shown in FIG. 1, the basic configuration of doubly-balanced mixer 16" shown in FIG. 2 will be described since the biasing networks used in the two mixers are similar.

Doubly-balanced mixer 16" shown in FIG. 2 has two pairs of mixing diodes and two impedance transformation networks. Certain elements used in doubly-balanced mixer 16" shown in FIG. 2 generally related to elements used in singly-balanced mixer 16 shown in FIG. 1 are identified with the same reference numbers but have additional designations "a" and "b" because of the doubly-balanced configuration of mixer 16".

Specifically, doubly-balanced mixer 16" includes a first balun 22' having the same configuration as balun 22 used in singly-balanced mixer 16 shown in FIG. 1. However, balun 22' is used to couple the single-ended RF signal, instead of the LO signal, to pairs of mixing diodes 24a, 26a and 24b, 26b in balanced impedance configuration. Mixer 16" also includes a second balun 48, having pairs of bifilar windings $48_1$, $48_2$ and $48_3$, $48_4$, which is used to couple the single-ended LO signal to pairs of mixing diodes 24a, 26a and 24b, 26b in a balanced impedance configuration. The LO signal is coupled to a first input terminal 50 of balun 48, at the junction of bifilar windings $48_1$ and $48_2$, and a second input terminal 52, at the junction of bifilar windings $48_3$ and $48_4$, is connected to ground. A first output terminal 54 is coupled to the junction of diodes 24b and 26b through a DC blocking capacitor 56b, having neglible impedance in the frequency range of interest of mixer 16", and a second output terminal 58 is coupled to the junction of diodes 24a and 26a through a DC blocking capacitor 56a. An IF signal is is produced at a "center" terminal 60, at the junction of bifilar windings $48_2$ and $48_3$, and is coupled to pre-filter 18. Due to the presence of DC blocking capacitors 56a and 56b, capacitor 38 may be eliminated if desired.

With the exception of biasing netwworks 40a and 40b, to be discussed below, the basic configuration of doubly-balanced mixer 16" shown in FIG. 2 is similar to the doubly-balanced mixer shown in FIG. 1 of the Price patent and that used in MTT007 type tuners employed in the RCA brand name color television receivers including CTC 133 chassis, documented in "RCA Color Television Basic Service Data CTC 133 Series", published by RCA Corporation, Indianapolis, Ind.

A brief description of the operation and advantages of balanced mixers will facilitate an understanding of the reasons for the need for and the particular configuration of biasing networks 40 and 40' of singly-balanced mixers 16 and 16' respectively shown in FIGS. 1 and 3 and biasing networks 40a and 40b of doubly-balanced mixer shown in FIG. 2.

A primary feature of a singly-balanced mixer is the virtual elimination of contributions from the LO signal at the IF output terminal and the RF input terminal due to the cancellation of the two local oscillator signal components developed across the balanced halves of the output side of the impedance transformation network. In a doubly-balanced mixer, contributions from both of the LO and RF signal are virtually eliminated at the IF output terminal. In addition, contributions from the LO signal is virtually eliminated at the RF input terminal and contributions from the RF signal are virtually eliminated at the LO input terminal. However, the cost of a doubly-balanced is greater than that of a singly-balanced mixer due to the relatively greater number of parts.

Figure 4:
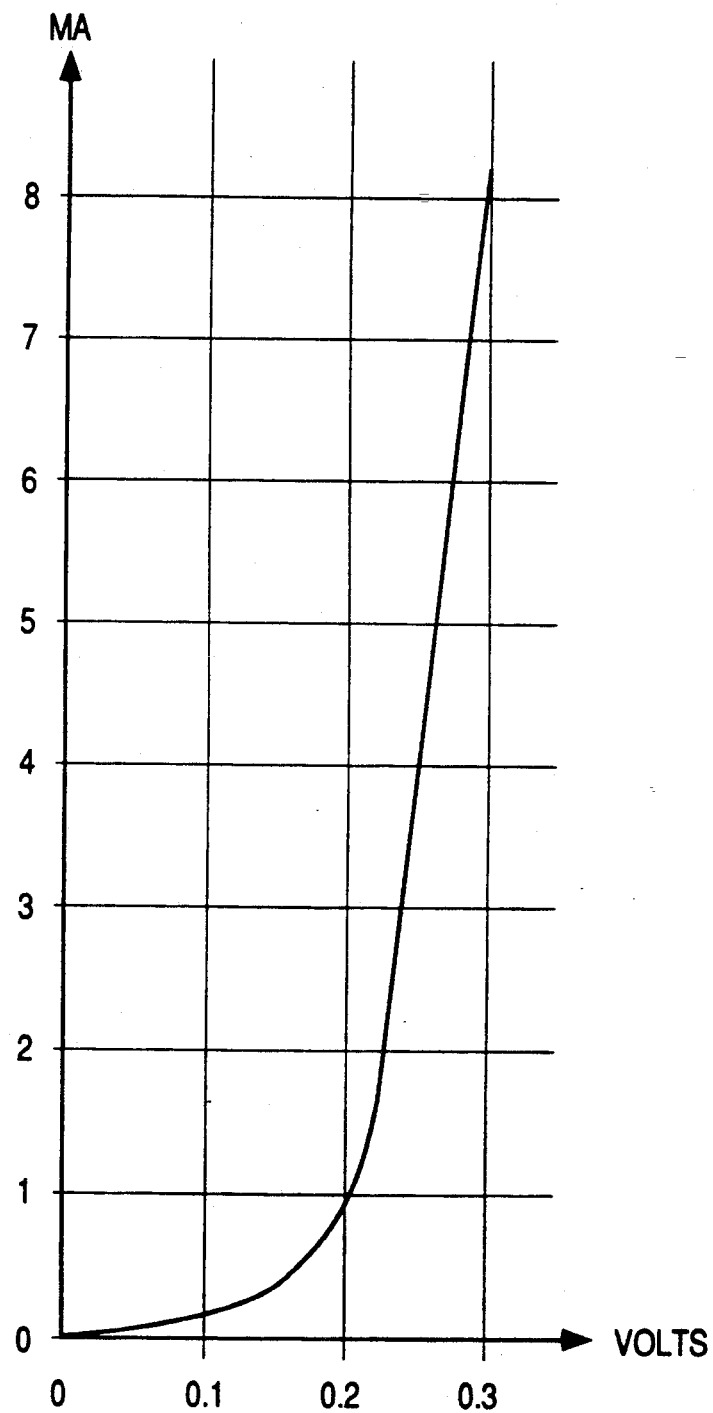
FIG. 4 is a graphical representation of the voltage vs. current characteristics of a diode useful in understanding the operation of the balanced mixers shown in FIGS. 1, 2 and 3.

Typically, the diodes of balanced mixers are operated as switches which have their conduction states controlled in response to the LO signal. In the exemplary embodiment shown in FIGS. 1, 2 and 3, the mixing diodes desirably are Schottky diodes, such as the HSM 88S available from Hitachi Corporation of Japan, exhibiting a much more abrubt transistion between a relatively "non-conducting" region and a relatively "conducting" region than a diode exhibiting a "square law"

characteristic. The voltage versus current transfer characteristic of the HSM 88S diode is shown in FIG. 4.

A square law mixer depends on the square law characteristics of the mixing devices (i.e., either diodes or transistors) to multiply the two input signals together. In a sense, balanced mixers can be thought of as being a type of synchronous demodulator in which the diodes are switched between a relatively non-conducting state and a relatively conducting state in response to the LO signal in order to route the RF signal to the output terminal of the mixer in a rectified form. Certain higher order terms of the Fourier series representing the output signal of a switching type of mixer are substantially reduced in amplitude, if not eliminated, compared with the same terms of the Fourier series representing the output signal of a square law mixer. As a result, switching type of mixers tend to have fewer unwanted products and result in less distortion than square law mixers.

For square law mixers, it it has been found very desirable to provide both: 1) a LO signal with a relatively constant amplitude; and 2) a source of stable bias voltage for the mixing diodes to ensure a relatively large amplitude for the desired product of the output signal consistent with relatively low amplitudes for unwanted products. For balanced mixers, since the diodes are typically operated as switching devices, it might be thought that the amplitude of the LO signal is not critical and that a bias supply for the diodes is not necessary as long the amplitude of the LO signal is high enough to cause the diodes to switch between the non-conducting and conducting states reliably. However, it may not be possible to readily maintain the amplitude of the LO signal at a sufficiently high level throughout a relatively large frequency range such as that of the VHF and UHF bands. In that case, it has been found desirable to bias the diodes at or near the transition point between the non-conducting and conducting regions of the current versus voltage transfer characteristic for the diodes in order to more reliably cause the diodes to switch between the two states.

In the Price arrangement, a bias current is provided for each pair of similarly poled diodes by connecting a respective resistor (13 kohms in the case of the CTC 133 chassis) between a source of supply voltage (+18 volts in the case of the CTC 133 chassis) and the anode of the first diode of the pair of similarly poled diodes. Two DC isolation capacitors, having negligible impedance in the frequency range of interest for the mixer, are utilized to separate the two bias current paths. The returns to ground for the bias currents are provided through windings of the RF input balun. The relatively high value resistors not only provide the bias currents, but also prevent the RF and LO signals from being attenuated. For purposes of comparison, it is noted that resistors 42a and 42b coupled to the source of supply voltage +$V_c$ and the associated capacitors 44a and 44b shown in FIG. 2 of the present application are topicologically arranged in the same fashion as corresponding elements shown in FIG. 1 of the Price patent. However, other aspects of the biasing arrangement according to the present invention are significantly different and are directed to a defficiency of the current source biasing network of Price as will be explained below.

The present invention is based in part in the recognition that while the Price mixer arrangement performs adequately when the amplitude of the LO signal can be maintained within a predetermined range, the current source biasing arrangement is not optimally suited to the situations in which the amplitude of the LO signal may vary significantly over the frequency range of interest, especially in the VHF and UHF bands, and from tuner to tuner. More specifically, the present invention is based in part on the recognition and that a voltage source biasing arrangement should be used instead of a current source biasing network. The present invention is also based in part to the manner in which a voltage source biasing arrangement may be provided in an extremely simple manner requiring only the addition of a single resistor.

In the Price arrangement, for each of a pair of mixing diodes (24a, 26b and 24b,26a), a voltage due to the rectification of the LO signal by the diodes may be developed across a respective DC isolation capacitor (44a and 44b, respectively), especially at high amplitudes of the LO signal. This is so because the DC impedance presented at the junction of the resistor and the DC isolstion capacitor is relatively high. The rectified voltage will vary as the amplitude of the LO signal varies. The variation may be very significant over the frequency range of interest and from tuner to tuner. As a result, the bias point for the diodes may vary significantly, and together with the variation of the amplitude of the LO signal itself, may cause unreliable diode switching action and less than optimum mixer performance.

In comparison to the source impedance of a current source, a voltage source presents a relatively low impedance. Accordingly, load variations will not significantly affect the voltage supplied by the voltage source. However, if a voltage source is simply substituted for the current source of the Price mixer arrangement, the RF signal will be "shunted" to ground through the relatively low source impedance of the voltage source, thereby upsetting the balanced impedance configuration of the mixer and seriously impairing its performance. In addition, a voltage source capable of directly supplying the relatively low voltage needed to bias the mixing diodes for optimal mixer operation are not usually found in television and radio receivers.

In singly-balanced mixer shown in FIG. 1, the connection of relatively low value value resistor 46 across capacitor 44 converts a relatively high impedance current source biasing network as disclosed in the Price patent to a relatively low impedance voltage source biasing network. Specifically, relatively high value resistor 42 and relatively low value resistor 44 comprise a voltage divider for producing the relatively low bias voltage for diodes 24 and 26 from the relatively high supply voltage +Vc. The DC return path to ground for the voltage divider is through windings $22_1$, $22_2$ and $22_3$, of balun 22. In singly-balanced mixer shown in FIG. 1, capacitor 44 is used to by-pass resistor 46. In comparison, the topicologically corresponding capacitor of the Price biasing network is used for DC isolation. Corresponding elements of biasing networks 40a and 40b of the doubly-balanced mixer shown in FIG. 2 are arrange in similar voltage divider configurations. Desirably, the voltage division ratio is selected to provide a bias voltage for each diode which is slightly less than the conduction voltage. By way of example, with respect to the transfer characteristic of Hitachi HSM 88S Schottky diode shown in FIG. 4, the voltage division ratio is selected to provide a total bias voltage of 0.445 volts, or 0.225 volts per diode, which is slightly less than the conduction voltage of 0.3 volts.

The Thevenin equivalent circuit of the voltage divider biasing networks of the mixers shown in FIGS. 1 and 2 is a voltage source (called a Thevenin voltage source) providing a voltage which is determined by the voltage divider ratio in series with a resistor (called the Thevenin source resistor) which is determined by the parallel combination of the two resistors. Since resistors 46, 46a and 46b of the voltage source biasing networks 40, 40a and 40, respectively, shown in FIGS. 1 and 2 have a relatively low value, the Thevenin source resistors have a relatively low value. As a result, the voltage developed across capacitors 44, 44a and 44b due to the diode rectification of the LO signal will be rapidly discharged during each cycle of the LO signal and the diode bias voltage will not be significantly affected. However, because the DC return paths to ground for the voltage dividers are through bifilar windings of baluns, a relatively high impedance to ground is provided with respect to the RF and LO signals. As a result, the balanced impedance configuration provided by the baluns is not disturbed. It is significant to note that the ground isolating impedance does not require an additional isolation element such as an inductor. An additional inductor not only adds cost but may cause parasitic responses.

Voltage biasing source 40 of singly-balanced mixer 16 shown in FIG. 1 may slightly unbalance the otherwise balanced impedance configuration between output terminals 34 and 36 of balun 22. The connection of a resistor 62, having a value substantially equal to that of resistor 42, between output terminal 36 and ground will tend to restore the balanced impedance configuration. The specific resistance values of resistors 42 and 62 may also be selected to be somewhat unequal to compensate for slight imbalances of balun 22 itself.

By way of example, the following table indicates component values suitable for voltage source biasing network 40 when employed in the singly-balanced mixer of the TCCR tuner used in RCA brand name color television receivers including CTC 156 chassis referred to above.

| COMPONENT | VALUE |
| --- | --- |
| $V_c$ | 17 volts |
| R42 | 1500 ohms |
| R46 | 56 ohms |
| R62 | 1200 ohms |
| C44 | 1000 |

Tests indicate that the addition of voltage source biasing network 40 significantly improves the performance of the TCCR tuner in several respects. With respect of the VHF band, voltage source biasing network 40 permitted a reduction of the local oscillator drive voltage in the order of 7 to 10 db. This advantageously reduces the power requirement of the local oscillator and therefore allows the local oscillator to be less complex and costly. It also reduces the leakage of the local oscillator signal to the RF input and therefore the potential for interference. As a result complex and costly circuitry otherwise required for this purpose can be eliminated. The improvement of performance is consistent over a relatively wide local oscillator amplitude range in the the order of −3 to +7 dbm. This further reduces constraints on the local oscillator and therefore allows for a further reduction of its compexity and cost.

Similar benefits can be expected with respect to the UHF oscillator.

Singly-balanced mixer 16' shown in FIG. 3 has a voltage source biasing network 40' somewhat similar to voltage source biasing networks 40, 40a and 40b shown in FIGS. 1 and 2, but is different in the manner in which the DC return to ground is provided because of the impedance transformer utilized for coupling the LO and RF signals to mixing diodes 24 and 26. In comparison to singly-balanced mixer 16 shown in FIG. 1, singly-balanced mixer 16' utilizes a RF transformer 64 instead of a balun. Specifically, the LO signal generated by local oscillator 14 is coupled across a primary winding $64_1$ of transformer 64 by means of the connection of the output of local oscillator 14 to a first input terminal 66 and the connection of a second input terminal 68 to ground. The the amplified RF signal produced by RF amplifier 12 is coupled to a center tap terminal 74 of a secondary winding $64_2$ of transformer 64. Mixing diodes 24 and 26 are connected in series across secondary winding 64b through output terminals 70 and 72.

As earlier explained, in mixer 16 shown in FIG. 1, a DC return to ground for voltage biasing source 40 consistent with a balanced impedance configuration for the RF and LO signals is advantageously provided by virtue of the connection of windings $22_1$, $22_2$ and $22_3$ of balun 22 to ground through terminal 30. In comparison, the balanced impedance configuration of secondary winding $64_2$ of transformer 64 of mixer 16' shown in FIG. 2 is distrubed if secondary winding $64_2$ is directly connected to ground to provide a DC return path for voltage biasing source 40'.

To provide for a DC return path for voltage source biasing network 40' while also maintaining a balanced configuration, a single relatively high value resistor (corresponding to resistor 42 utilized in voltage source biasing network 40 shown in FIG. 1) is replaced by two relatively high value resistors 76 and 78 of substanstially the same value. Resistor 76 is connected in the same circuit location as resistor 42 of biasing network 40 shown in FIG. 1 and resistor 78 is connected, in a balancing relationship with resistor 76, between terminal 72 and ground. Resistor 46 and capacitor 44 are connected in the same manner as in voltage divider 40 shown in FIG. 1. Resistors 76, 46 and 78 form a voltage divider by virtue of the DC connection between resistors 46 and 78 provided by secondary winding 64b. The bias voltage for diodes 24 and 26 is developed across resistor 46.

With respect to diodes 24 and 26, the equivalent circuit of the voltage divider is a voltage source comprising a Thevenin voltage source supplying a voltage which is determined by the voltage division between resistor 46 and the series combination of resistors 76 annd 78 and a Thevenin source resistor which is determined by the parallel comination of resistor 46 and the the series combination of resistors 76 and 78. The voltage source is isolated from ground with respect to RF and LO signals in a balanced impedance configuration by virtue of resistor 78.

For the same bias voltage provided by biasing network 40 of singly-balanced mixer 16 shown in FIG. 1, assuming resistors 42 of biasing networks 40 and 40' have the same resistance value, resistors 76 and 78 should each have a resistance value substantially equal to one-half the resistance value of resistor 42. If secondary winding 64b is balanced with respect to center tap terminal 74, resistors 76 and 78 should both have the same nominal resistance value to maintain the balanced impedance configuration. If secondary winding 64b is slightly imbalanced, the resistance values of resistors 42 and 62 may be selected to be somewhat unequal to compensate the imbalance of secondary winding 64b.

The voltage source provides a relatilvely low value bias voltage and a relatively low value source resistor by virtue of relatively low value source resistor 44. The relatively low value bias voltage is suitable for biasing diodes 24 and 26 slightly below the conduction voltage. The relatively low value source resistor ensures that the bias voltage developed across by-pass capacitor 46 will not be significantly changed by the rectification of the LO signal by diodes 24 and 26. However, as earlier noted, with respect to the RF and LO signals, the voltage source is isolated from ground with respect to RF and LO signals in a balanced impedance configuration by virtue of resistor 78.

I claim:

1. In a tuner including means for supplying a radio frequency (RF) signal and means for supplying a local oscillator (LO) signal, a mixer for combining said RF and LO signals to produce an intermediate frequency (IF) signal comprising:
   at least a first pair of uni-directional conduction devices connected in series and poled in the same direction;
   a capacitance element, having negligible impedance in the frequency range of said RF and LO signals, connected in series with said series connection of said uni-directional conduction devices;
   impedance transformation means including at least first and second windings for coupling at least one of said RF and LO signals across said series connection of said uni-directional conduction devices and said capacitance element in a balanced impedance configuration;
   a source of supply voltage;
   a first resistance element connected between said source of supply voltage and the junction between said series connection of said uni-directional conduction devices and said capacitance element;
   a second resistance element connected across said capacitance element;
   a point of reference potential; and
   connection means for connecting said point of reference potential to said second resistance element through at least one of said windings so that said first and second resistors form a voltage divider between said source of supply voltage and said point of reference potential for providing a bias voltage for said first and second uni-directional conduction devices, the Thevenin equivalent circuit of said voltage divider being a voltage source having a relatively low source impedance.

2. The tuner recited in claim 1, wherein:
   said impedance transformation means comprises a balun in which said first and second windings are wound in bifilar fashion and further includes third and fourth windings wound in bifilar fashion, said first, second third and fourth windings being connected in series;
   said series connection of said uni-directional conduction devices and said capacitance element being connected across said series connection of said first, second, third and fourth windings of said balun; and
   said connection means comprises a connection between a junction between two of said windings of said balun and said point of said reference potential.

3. The tuner recited in claim 2, wherein:
   said mixer is a singly-balanced mixer;
   said capacitance element is connected to said first winding; and
   a third resistance element, having a value at least approximating the value of said first resistance element, is coupled between the junction of said series connection of said uni-directional conducting devices and said fourth winding and said point of reference potential.

4. The tuner recited in claim 2, wherein:
   said LO signal is coupled to said balun.

5. The tuner recited in claim 2, wherein:
   said RF signal is coupled to said balun.

6. The tuner recited in claim 1, wherein:
   said first and second windings comprise the primary and secondary windings of a transformer;
   said series connection of said uni-directional conduction devices and said capacitance element being connected across said secondary winding of said transformer.

7. The tuner recited in claim 6, wherein:
   said mixer is a singly-balanced mixer;
   said capacitance element is connected to one end of said secondary winding; and
   a third resistance element, having a value at least approximating the value of said first resistance element, is coupled between the other end of said secondary winding and said point of reference potential.

8. The tuner recited in claim 7, wherein:
   said LO signal is coupled to said primary winding.

9. In a tuner including means for supplying a radio frequency (RF) signal and means for supplying a local oscillator (LO) signal, a mixer for combining said RF and LO signals to produce an intermediate frequency (IF) signal comprising:
   at least a first pair of uni-directional conduction devices connected in series and poled in the same direction;
   impedance transformation means for coupling at least one of said RF and LO signals across said series connection of said uni-directional conduction devices in a balanced impedance configuration;
   a source of supply voltage;
   a first resistance element connected between said source of supply voltage and said series connection of said uni-directional conduction devices;
   a second resistance element;
   a point of reference potential; and
   means for connecting said point of reference potential to said second resistance element through at least a portion of said impedance transformation network so that said first and second resistors form a voltage divider between said source of supply voltage and said point of reference potential for providing a bias voltage for said first and second uni-directional conduction devices, the Thevenin equivalent circuit of said voltage divider being a voltage source having a relatively low source impedance.

* * * * *